US007013060B2

(12) United States Patent
Sugiyama et al.

(10) Patent No.: US 7,013,060 B2
(45) Date of Patent: Mar. 14, 2006

(54) OPTICAL CROSS-CONNECT DEVICE

(75) Inventors: Teruya Sugiyama, Shizuoka (JP);
Mitsuteru Inoue, Okazaki (JP);
Dong-Hak Shin, Toyohashi (JP);
Hitoshi Masuda, Yamato (JP)

(73) Assignees: Pegasusnet Co., Ltd., Shizuoka-ken (JP); T. S. Photon Co., Ltd., Shizuoka-ken (JP)

( * ) Notice: Subject to any disclaimer, the term of this patent is extended or adjusted under 35 U.S.C. 154(b) by 0 days.

(21) Appl. No.: 11/182,143

(22) Filed: Jul. 15, 2005

(65) Prior Publication Data

US 2005/0249456 A1 Nov. 10, 2005

Related U.S. Application Data

(62) Division of application No. 10/402,464, filed on Mar. 28, 2003, now Pat. No. 6,947,626.

(30) Foreign Application Priority Data

Apr. 1, 2002 (JP) ............................... 2002-099430

(51) Int. Cl.
*G02B 6/26* (2006.01)
*G02B 6/42* (2006.01)
(52) U.S. Cl. .......................... 385/17; 385/16; 385/40; 359/15; 359/34
(58) Field of Classification Search ................. 385/16, 385/17, 24, 28, 31, 39, 40; 359/15, 27, 34

See application file for complete search history.

(56) References Cited

U.S. PATENT DOCUMENTS 5,136,666 A * 8/1992 Anderson et al. ............. 385/24
5,247,593 A * 9/1993 Lin et al. ...................... 385/17
6,847,755 B1 * 1/2005 Aoki et al. ................... 385/18

* cited by examiner

*Primary Examiner*—Juliana Kang
*Assistant Examiner*—Daniel Petkovsek
(74) *Attorney, Agent, or Firm*—Donald E. Schreiber (57) ABSTRACT

An optic switch for cross-connecting input light signals incoming from inlet fiber cables to outlet fiber cables is disclosed that makes use of a holographic filter (5) having a series of preformed different speckle patterns, each in the form of a hologram ($H_1$, $H_2$, ...). Associated with input light signals guided past respective inlet passages (4in) of a multimode waveguide (4), different speckle patterns are formed by applying different control voltages across respective electrode pairs (10, 10a) provided thereon. These speckle patterns past a single outlet passage (4out) of the multimode waveguide (4) into which the inlet passages (4in) converge are joined together and enter the holographic filter (5) in which an input light signal is selectively switched, addressed and cross-connected to an outlet waveguide (2) through a region thereof where a formed speckle pattern coincides with a preformed speckle pattern. The multi mode waveguides (4) is formed in, e.g., a $LiNbO_3$ photorefractive substrate (3).

8 Claims, 5 Drawing Sheets

OPTICAL CROSS-CONNECT DEVICE

This application is a division under 35 U.S.C. § 120 of U.S. patent application Ser. No. 10/402,464 filed Mar. 28, 2003 now U.S. Pat. No. 6,947,626, that claimed priority under 35 U.S.C. § 119(a)–(d) or (f) from Japanese patent application 2002-099430 filed Apr. 1, 2002.

BACKGROUND OF THE INVENTION

1. Field of the Invention

The present invention relates to an optical cross-connect device that is capable of changing paths for optical signals, viz. switching, addressing and cross-connecting a plurality of input light signals to a plurality of outlet optical waveguides directly without converting the optical signals into electrical signals, in a WDM (Wavelength Division Multiplexing) transmission control apparatus that permits high-speed signal transmission in an optical backbone network.

2. Description of the Prior Art

With the tremendous spreads of personal computers and cellular phones for use to access Internet sites, high speed broadband communication services by xDSL and sustained connection options have come into wide use in the communication infrastructure as well. And, to harmonize with the next-generation Internet communication and the next-generation cellular phone a further drastic rise in the line speed in the backbone network is being sought after.

In transmitting signals on optical-fiber cables, the conventional TDM (time division multiplexing) system permits light signals of only one wavelength to be transmitted on one optical-fiber cable. In contrast the WDM (wavelength division multiplexing) system allows light signals of a number of different wavelengths to be transmitted on one optical-fiber cable, and hence permits increasing the bands and elevating the line speed to a large extent with the use of the established optical-fiber cables. In a WDM transmission apparatus using such a WDM technique, switching paths for input light signals and paths for output light signals, that is, cross-connecting them, rapidly makes it essential to include an optic switch that is capable of directly switching those optical paths mutually without the need to convert the input light signals into electric signals and the latter to the output light signals.

So far, four types of such optic switches have been proposed. The first is what is called the "mirror type switch" in which a small mirror formed of a Si substrate is either rotated or vertically moved to cause an incident light to be reflected at a specified angle to change its path. The second is what is called the "planar optical waveguide type switch" that uses a waveguide having a crossover in which a heater is embedded, the heater being heated up to change its refractive index for an incident light, thereby changing its path. The third is what is called the "bubble type switch" in which the heater is replaced by a groove filled with a liquid so that the generation of bubbles in the groove may be controlled to change the angle of reflection of an incident light, thereby changing its path. The fourth is what is called the "mechanical type switch" in which an optical-fiber cable is bent, e.g., with an electromagnet, to change the path of an incident light.

Of these prior types of optic switches, the "mirror type switch" is considered the largest in scale at this point of time inasmuch as it can provide channels reaching several hundreds in number. However, this switch requiring the movement of a small mirror that must be rotated or vertically moved has a problem in durability. It also has the problem that its switching speed is as low as requiring 50 milliseconds for switching. On the other hand, the "mechanical type switch" is operable at a switching speed as relatively high as can be switched in 10 milliseconds or less, but has the problem that it can only provide several channels and hence cannot be utilized but for limited, small scale applications. The "planar optical waveguide type switch" and the "bubble type switch" are also operable at a switching speed as relatively high as can be switched in 10 milliseconds or less, and can provide channels which are several tens in number. However, using the structure requiring that a groove filled with a heater or liquid be formed in a substrate, these switches have left more or less to be desired in durability. Further, while no mechanical movement is required in these switches, they do require more or less mechanical components, presenting the problem that their structures become intricate.

BRIEF SUMMARY OF THE INVENTION

Made to solve the problems mentioned above, the present invention is aimed to provide an optical cross-connect device or an optic switch which requires no part or component moving mechanically and is simple in structure, which can provide several hundreds to thousands of channels sufficient to meet with the requirements of an ultra-large scale WDM transmission system and which moreover is operable at an extremely high switching speed, thereby permitting rapidly driving it forward to build up a next generation photonic network.

In order to achieve the object mentioned above, there is provided in accordance with the present invention an optical cross-connect device that can be characterized in that it comprises: a multimode optical waveguide formed in a waveguide supporting substrate disposed between M input optical fibers and N output optical fibers, the said multimode optical waveguide having a plurality of inlet optical waveguides for receiving and guiding therethrough light beams from the said input optical fibers and a single outlet optical waveguide into which the said inlet optical waveguides converge; a plurality of electrode means associated with the said inlet optical waveguides of the said multimode optical waveguide; a light address detector means responsive to the said light beams prior to entry into the said multimode optical waveguide for detecting respective addresses attached to light signals carried by the said light beams; a power supply responsive to the said light address detector means for applying preselected control voltages to the said electrode means to produce with the said laser beams guided through the said multimode optical waveguide, particular speckle patterns preselected corresponding to the detected addresses of the said light signals, respectively; a holographic filter made of a recording medium such as of photorefractive crystal, photopolymer or photorefractive polymer formed with holograms for providing destinations for the said light signals which correspond to the said light signal addresses, respectively; and a recording means for preforming such holograms in a recording medium to form the said holographic filter, the said recording means including a laser unit for providing a laser beam of a uniform mode, and optical components for collimating and splitting the laser beam, including a lens means and a beam splitter, and a beam reflecting mirror.

The optical cross-connect device of the present invention can also be characterized in that it includes a means for preforming a recording medium with holograms adapted to switch an input light to a designated address, the said means including a laser unit capable of providing a laser beam of a uniform mode, a lens means for collimating the laser beam from the laser unit into a uniformly collimated laser beam, a beam splitter for splitting the latter laser beam into two laser beams and a beam reflecting mirror for reflecting one of the two laser beams split by the beam splitter to irradiate a region of the said recording medium becoming a holographic filter therewith.

The optical cross-connect device of the present invention can also be characterized by ah optic switch including a multimode optical waveguide adapted to receive input laser beams input in M input optical fibers and having a plurality of electrode means associated therewith, respectively, and a holographic filter having a plurality of preformed different speckle patterns in a plurality of regions thereof, respectively, which are in turn associated with output optical fibers, respectively, whereby applying a plurality of different control voltages Vi (where i=1, 2, ..., N) to the electrode means forms a plurality of different speckle patterns in the multimode optical waveguide and coincidence of a said formed speckle pattern with a said preformed speckle pattern in a said region of the holographic filter allows a said input laser beam with the said formed coincident speckle pattern to be selectively switched, addressed and cross-connected to a said output optical waveguide associated with the said coincident region of the holographic filter.

The optical cross-connect device of the present invention can also be characterized by an optic switch comprising a plurality of waveguide supporting substrates mounted one on top of another corresponding to light signals of different wavelengths λi (where i=1, 2, ..., L), wherein each of the said waveguide supporting substrates has a plurality of electrode pairs, M in number, with each pair of electrodes juxtaposed with each other across one of a like plurality of optical waveguides, M in number, respectively, and a power supply means for applying different control voltages to the said electrode pairs, respectively.

The optical cross-connect device of the present invention can also be characterized by an optic switch comprising a holographic filter provided at an output side of the switch, a plurality of optical waveguides provided at an input side of the switch for guiding a plurality of input laser beams, respectively, a plurality of electrode pairs associated with the optical waveguides, respectively, and a power supply for applying different control voltages to the electrode pairs, respectively, such that different speckle patterns are created associated with the respective laser beams in the respective waveguides and the different speckle patterns created individually at the said input side are linearly added together in the holographic filter at the said output side of the switch. Preferably, the said holographic filter has a plurality of pre-formed different speckle patterns in a plurality of regions thereof, respectively, which are in turn associated with a plurality of output optical waveguides, respectively, whereby coincidence of a said created speckle pattern with a said preformed speckle pattern in a said region of the holographic filter allows a said input laser beam with the said created coincident speckle pattern to be selectively switched, addressed and cross-connected to an output optical waveguide associated with the said coincident region of the holographic filter. Preferably, also the said different control voltages are voltages selected from a class that consists of binary voltages, analog voltages and a combination of binary and analog voltages.

According to these features of the present invention, there is provided an optical cross-connect device that has no part or component driven mechanically and is made up only of optical materials, the device being compact and of low cost and offering an extremely high switching speed as a stable device that is simple in structure, and highly reliable and economical.

The present invention also provides, in a method aspect thereof, a method of cross-connecting a plurality of input light signals incoming from a plurality of inlet optical waveguides to a plurality of outlet optical waveguides, which method comprises the steps of a) preparing a holographic filter having a series of preformed different speckle patterns in a series of regions thereof having the said plurality of outlet optical waveguides associated therewith, respectively; b) passing the input light signals, each carried by a laser beam, through a plurality of inlet passages of a multimode optical waveguide, respectively, with different control voltages applied across them, respectively, to form different speckle patterns associated with those laser beams, respectively, and c) introducing the laser beams past the respective inlet passages, and then past a single outlet passage, of the said multimode optical waveguide, into the said holographic filter wherein coincidence of a said formed speckle pattern with a said preformed speckle pattern in a said region of the holographic filter allows a said input light signal associated with the said formed coincident speckle pattern to be selectively switched, addressed and cross-connected to a said output optical waveguide that is associated with the said coincident region of the holographic filter.

The said preformed different speckle patterns are specifically pre-recorded in the form of a hologram thereof in a recording medium becoming the holographic filter, advantageously by: $a_1$) splitting a laser beam of a uniform mode into a first and a second laser beam, passing such first laser beams through the inlet passages of the said multimode optical waveguide with a set of different control voltages applied across them, respectively, to form speckle patterns each as a function of a said applied voltage, joining the first laser beams together past said multimode optical waveguide into a single multimode laser beam having the said different speckle patterns associated therewith and causing the multimode laser beam to intersect with the second laser beam at one of the said successive regions of the recording medium to cause them to interfere with each other thereat, thereby recording the said different speckle patterns as a set in the form of a hologram thereof at the said one region, and $a_2$) repeating the step $a_1$) successively while applying different sets of different control voltages across the inlet passages of the said multimode optical waveguide and recording resultant successive sets of speckle patterns in the form of holograms thereof successively at following successive regions in the said recording medium, thereby forming the said holographic filter.

Advantageously, the said recording medium forming the said holographic filter is made of photorefractive crystal such as $LiNbO_3$, photopolymer or photorefractive polymer.

Advantageously, the said different speckle patterns individually formed past the respective inlet passages of the said multimode optical waveguide are linearly added together in the single outlet passage of the said multimode optical waveguide prior to entering the said holographic filter.

The said voltages applied may be binary voltages, analog voltages or a combination of binary and analog voltages, according to the electrode shape.

According to these feature in the method aspect of the present invention, a highly reliable and economical method is provided that can be adopted in manufacturing an optic switch which is compact and of low cost and offering an extremely high switching speed as a stable device that is simple in structure, and highly reliable and economical.

The present invention also provides, in a further aspect thereof, an optic switch for cross-connecting a plurality of input light signals incoming from a plurality of inlet optical waveguides to a plurality of outlet optical waveguides, which comprises: a multimode optical waveguide having a plurality of inlet passages for receiving the input light signals, each carried by a laser beam, from the inlet optical waveguides, respectively; a plurality of electrode means each associated with each of the inlet passages of the said multimode optical waveguide, respectively; a power supply means for applying different control voltages across the said electrode means, respectively, such that different speckles patterns are formed associated with those laser beams past the inlet passages of the said multimode optical waveguide, respectively; the said multimode optical waveguide having a single outlet passage into which the said inlet passages converge to convert the said laser beams into a multimode laser beam and in which the said different speckle patterns are linearly joined together; and a holographic filter for receiving the said different speckle patterns and filtering the said multimode laser beam containing the said input light signals from the said multimode optical waveguide, the said holographic filter having a plurality of different sets of preformed different speckle patterns, each in the form of a hologram thereof, in a plurality of successive regions of the filter which have the said outlet optical waveguides associated therewith, the said holographic filter selectively switching, addressing and cross-connecting a said input light signal to a said outlet optical waveguide through a said region of the holographic filter where a said received speckle pattern that is associated with the said input light signal coincides with a said preformed speckle pattern.

Each set of the said preformed different speckle patterns is specifically in the form of a hologram thereof prerecorded in a recording medium becoming the holographic filter, advantageously by: $a_1$) splitting a laser beam into a first and a second laser beam, passing such first laser beams through the inlet passages of the said multimode optical waveguide with a set of different control voltages applied across it to form different speckle patterns each as a function of a said applied voltage, joining the first laser beams together past the single outlet passage of the said multimode optical waveguide into a multi-mode laser beam having the said different speckle patterns associated therewith and causing the multimode laser beam to intersect with the second laser beam at one of successive regions of the recording medium to cause them to interfere with each other thereat, thereby recording the said different speckle patterns as a set in the form of a hologram thereof at the said one region, and $a_2$) repeating the step $a_1$) successively while applying different control voltages across the inlet passages of a said multimode optical waveguide and recording resultant successive sets of speckle patterns in the form of holograms thereof successively at following successive regions in the recording medium, thereby forming the holographic filter.

Advantageously, the said recording medium forming the said holographic filter waveguide supporting substrate is formed of nonlinear photocrystal or photopolymer.

According to the preceding features of the present invention, an optic cross-connect switch which is compact and of low cost and offering an extremely high switching speed is provided as a stable device that is simple in structure, and highly reliable and economical.

The present invention also provides in a further device aspect thereof an optic device for cross-connecting a plurality of input light signals incoming from a plurality of inlet optical waveguides to a plurality of outlet optical waveguides, which includes: a multimode optical waveguide having a plurality of inlet passages for receiving input light signals, each carried by a laser beam, from the said inlet optical waveguides, respectively; a plurality of electrode means each associated with each of the inlet passages of the said multimode optical waveguide, respectively; a power supply means for applying a set of different control voltages across the said electrode means, respectively, such that different speckles patterns are formed associated with those laser beams past the inlet passages of the said multimode optical waveguide, respectively; the said multimode optical waveguide having a single outlet passage into which the said inlet passages converge to convert the said laser beams into a multimode laser beam and in which the said different speckle patterns are linearly joined together; a holographic filter for receiving the said different speckle patterns and filtering the said multimode laser beam containing the said input light signals from the said multimode optical waveguide, the said holographic filter having a plurality of different sets of preformed different speckle patterns, each set in the form of a hologram thereof, in a plurality of successive regions of the filter which have the said outlet optical waveguides associated therewith, the said holographic filter selectively switching, addressing and cross-connecting a said input light signal to a said outlet optical waveguide through a said region of the holographic filter where a said received speckle pattern that is associated with the said input light signal coincides with a said preformed speckle pattern; a set of waveguide supporting substrates mounted one on top of another, corresponding in number to different wavelengths ($\lambda_1, \lambda_2, \ldots, \lambda_L$) carrying input light signals, each of the said waveguide supporting substrates being formed therein with a said multimode optical waveguide; and a set of holographic filter plates mounted one on top of another, corresponding in number to the said waveguide supporting substrates, each of the said holographic filter plates being formed therein with the said holographic filter and attached to each of the said waveguide supporting substrates, respectively, so that the said holographic filter and the single outlet passage of the said multimode optical waveguide in a said waveguide supporting substrate and a said holographic filter plate attached together communicate with each other. The waveguide supporting substrate is advantageously formed of a photorefractive crystal such as LiNbO3 in the form of a wafer, or a Si substrate with several polymer layers.

In this case, each set of the said preformed different speckle patterns is here again specifically in the form of a hologram thereof prerecorded in a recording medium becoming the holographic filter, advantageously by: $a_1$) splitting a laser beam into a first and a second laser beam, passing such first laser beams through the inlet passages of the said multimode optical waveguide with a set of voltages applied across them, respectively, to form different speckle patterns each as a function of a said applied voltage, joining the first laser beams past the single outlet passage of the said multimode optical waveguide into a single multimode laser beam having the said different speckle patterns associated therewith and causing the multimode laser beam to intersect with the second laser beam at one of successive regions of the recording medium to cause them to interfere with each other thereat, thereby recording the speckle patterns as a set in the form of a hologram thereof at the said one region, and $a_2$) repeating the step $a_1$) successively while applying different sets of different control voltages across the inlet passages of the said multimode optical waveguide and recording resultant successive sets of speckle patterns in the form of holograms thereof successively at following successive regions in the recording medium, thereby forming the holographic filter.

Advantageously, the optic device further includes a first and a second set of AWG (Arrayed Waveguide Grating) type converters having a first and a second set of optical fiber cables connected thereto, respectively, and being formed in respective sets of AWG plates, the said AWG plates of each of the said first and second sets being mounted side by side in a direction transverse to a direction in which the said waveguide supporting substrates/holographic filter plates are mounted one on top of another, wherein: the AWG type converters of the said first set in receipt of a plurality of sets of incoming optical communication signals mixed in wavelength, i.e., of different wavelengths ($\lambda_1, \lambda_2, \ldots, \lambda_L$) from the optical fiber cables of the said first set, respectively, are adapted to convert them into a plurality of sets of light signals, respectively, with each set of such light signals being of an identical wavelength ($\lambda_1, \lambda_2, \ldots, \lambda_L$) for entry into the inlet passages of the said multimode optical waveguide in each of the said waveguide supporting substrates, and the AWG converters of the said second set in receipt of a plurality of sets of output light signals with each set of output light signals of an identical wavelength ($\lambda_1, \lambda_2, \ldots, \lambda_L$) from the said holographic filter in each of the said holographic filter plates, respectively, are adapted to convert them into a plurality of sets of optical communication signals mixed in wavelength, i.e., of different wavelengths ($\lambda_1, \lambda_2, \ldots, \lambda_L$) which are outgoing through the optical fiber cables of the said second set, respectively.

Advantageously, the optic device may further include a second set of waveguide supporting substrates mounted one on top of another, corresponding in number to different wavelengths ($\lambda 1, \lambda 2, \ldots, \lambda_L$) carrying input light signals, each of the waveguide supporting substrates of the said second set being formed therein with a said multimode optical waveguide; and a second set of holographic filter plates mounted one on top of another, corresponding in number to the waveguide-supporting substrates of the said second set, each of these holographic filter plates being formed therein with a second holographic filter and attached to each of these waveguide supporting substrates, respectively, so that the holographic filter and the multimode optical waveguide in a said waveguide supporting substrate of the second set and a said holographic filter plate of the second set attached together communicate with each other, wherein: the AWG type converter of the said second set in receipt of a plurality of sets of incoming optical communication signals mixed in wavelength, i.e., of different wavelengths ($\lambda_1, \lambda_2, \ldots, \lambda_L$) from the optical fiber cables of the said second set, respectively, are adapted to convert them into a plurality of sets of light signals, respectively, with each set of such light signals being of an identical wavelength ($\lambda_1, \lambda_2, \ldots, \lambda_L$) for entry into the inlet passages of the said multimode optical waveguide in a said waveguide supporting substrate of the second set, respectively, and the AWG plates of the said first set in receipt of a plurality of sets of output light signals with each set of such output light signals of an identical wavelength ($\lambda 1, \lambda 2, \ldots, \lambda_L$) from the holographic filter in a said holographic filter plate of the said second set, respectively, are adapted to convert them into a plurality of sets of optical communication signals mixed in wavelength, i.e., of different wavelengths ($\lambda 1, \lambda 2, \ldots, \lambda_L$) which are outgoing through the optical fiber cables of the said first set, respectively. So constructed as mentioned above, the device is made operative bidirectionally between the first and second sets of optical fiber cables.

According to the preceding features of the present invention, an optical cross-connect device which is compact and of low cost and offering an extremely high switching speed is provided as a stable device that is simple in structure, highly reliable and economical.

BRIEF DESCRIPTION OF THE DRAWINGS

These and other objects, features and features and advantages of the present invention as well as other manners of its implementation will become more readily apparent, and the invention itself will also be better understood, from the following detailed description when taken with reference to the drawings attached hereto showing certain illustrative forms of implementation of the present invention. In the drawings.

DETAILED DESCRIPTION

Figure 1:
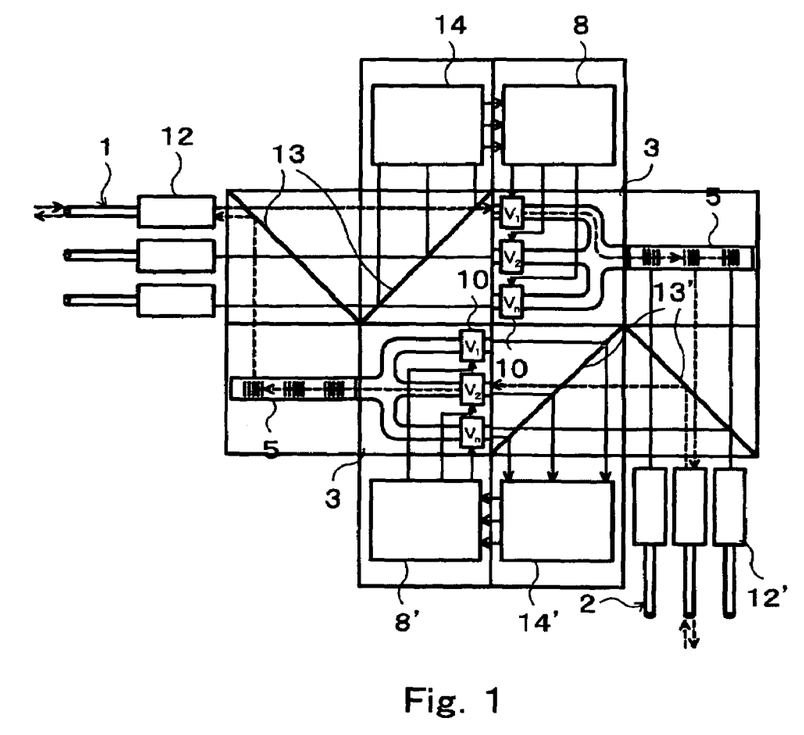
FIG. 1 is a general conceptual view of an optical cross-connect device according to the present invention.
Figure 2:
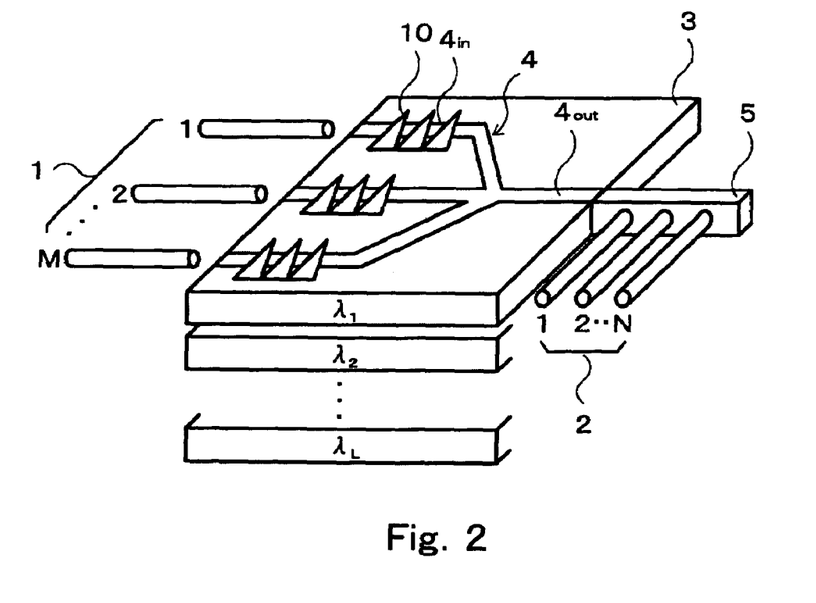
FIG. 2 is a conceptual view of an optic switch in the optical cross-connect device of the invention for applying an electrooptical effect, to a multimode optical waveguide having a plurality of inlet passages which converge into a single outlet passage.

FIG. 1 is a general conceptual view of an optical cross-connect device according to the present invention, and FIG. 2 is a conceptual view of an optic switch in the optical cross-connect device of the invention for applying an electrooptical effect to a multimode optical waveguide. Referring to FIG. 1, mixed light signals carried on various wavelengths ($\lambda_1, \lambda_2, \ldots, \lambda_L$) that are L in number are introduced, respectively, from an M number of input optical fibers 1, and are passed through an AWG (Arrayed Waveguide Grating) type coupler/divider (converter) 12, an array of such converters, where they are divided into L sets of light signals with each set having light signals which are M in number) and of an identical wavelength ($\lambda_1, \lambda_2, \ldots, \lambda_L$). The M light signals for each of the L wavelengths then past a dichroic mirror 13 are guided into one of multimode optical waveguides 4 that are L in number. Each multimode optical waveguide 4 comprises its inlet passages 4 in which are M in number, serving as M single-mode optical waveguides and its outlet passage 4out, serving as a single multimode optical waveguide into which they converge. Guided past each multimode optical waveguide 4, these M light signals are coupled together into a mixed, multimode light that contains the M input light signals, which are then switched at each of holographic filters 5, N in number, to appear at its desired outlets as signal destinations. The input light signals given their destinations or three-dimensionally cross-connected to their destinations at the holographic filters 5 may then be guided past a dichroic filters 13' to enter an AWG type coupler/divider (converter) 12', again an array of such converters, where they are coupled into N output signals for each of L wavelengths to enter N optical fiber cables 2, respectively. As can thus be seen, the optical cross-connect device of the present invention is so made up that it has no part or component driven mechanically and is composed only of optical materials.

The multimode optical waveguides 4 whose number corresponds to the number of different wavelengths ($\lambda_1$, $\lambda_2$, ..., $\lambda_L$) are each formed in a thin waveguide supporting substrate or plate 3 made of, e.g., LiNbO$_3$ as a nonlinear, photorefractive crystal, The substrate 3 may also be a Si substrate with several polymer layers that is capable of bringing about an electrooptical effect. Each multimode optical waveguide 4 has its M inlet passages 4 in for guiding M light signals of an identical wavelength, $\lambda_1$ as shown, the inlet passages 4in converging into the single outlet passage 4out in the waveguide plate 3. Each inlet passage 4in has a pair of electrodes (10, 10a) disposed across it for applying a voltage from a power supply 8 across a portion thereof and so shaped as to be optimum for forming a speckle pattern controllably past it. As illustrated, one electrode 10 of the electrode pair is disposed above each inlet passage 4 in and then shaped triangularly or saw-tooth. If a voltage is applied across the electrode pair, then a laser beam 9a passing through the inlet passage 4 in beneath the electrode 10 produces electrooptically a particular speckle pattern corresponding to a given condition. Such a speckle pattern is determined primarily depending on the structure of the electrode 10, the applied voltage and the optical properties of the optical waveguide 4. Thus, a particular speckle pattern can be there formed as a function of the voltage applied. The speckle pattern produced also undergoes no variation with time unless the external environment is varied. For this reason, the device can be realized as a stable device that is simple in structure, and highly reliable and economical.

Figure 3:
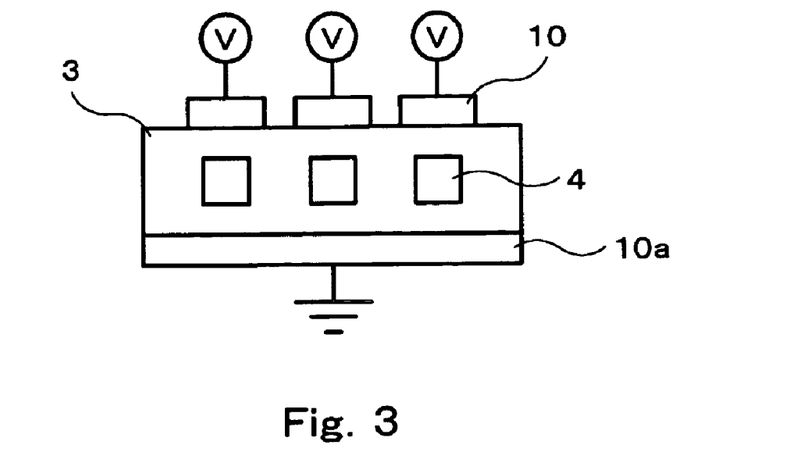
FIG. 3 is a cross sectional, elevational view illustrating the relationship in position between each electrooptical electrode pair and each of the inlet passages of the multimode waveguide which corresponds thereto.
Figure 4:
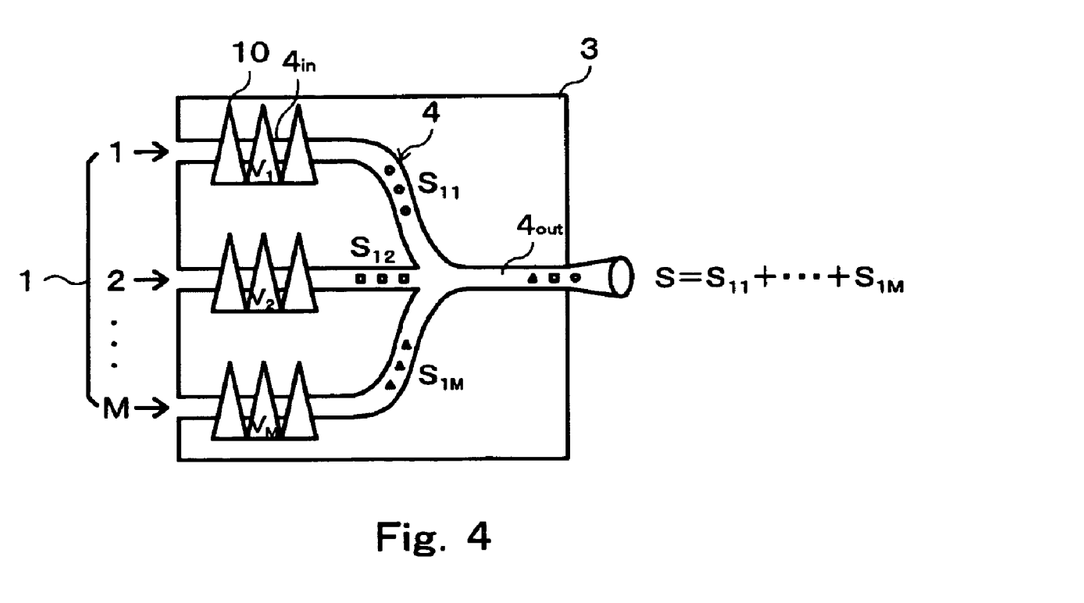
FIG. 4 is a plan view conceptually illustrating how laser beams input in those inlet passages in the multimode optical waveguide produce their speckle patterns each determined by a different voltage applied to a electrode pair across each inlet passage of the multimode optical waveguide and how a resultant multiple mode laser beam past the multimode optical waveguide is input into the holographic filter.

FIG. 3 is a cross sectional, elevational view illustrating the relationship in position and arrangement between the electrode 10 and the optical waveguide passage 4 corresponding thereto to make it easy to under stand how they are formed and located relative to each other, the counter electrode 10a being shown as a common electrode grounded. FIG. 4 is a plan view conceptually illustrating how each laser beam input from an optical fiber produces a particular speckle pattern determined from the electrode 10 past a particular inlet passage 4in of the multimode optical waveguide 4 and such a laser beam becoming multiple in mode past the single outlet passage 4out of the multimode optical waveguide 4 is introduced into the holographic filter 5 to make it easy to understand the speckle pattern formed in each particular inlet passage 4in of the multimode optical waveguide 4 and how such speckle patterns formed in different inlet passages 4in of the multimode optical waveguide 4 are added together in the single outlet passage 4out of the multimode optical waveguide 4, then entering into the holographic filter 5 that completes the optic switch of the present invention.

Figure 5:
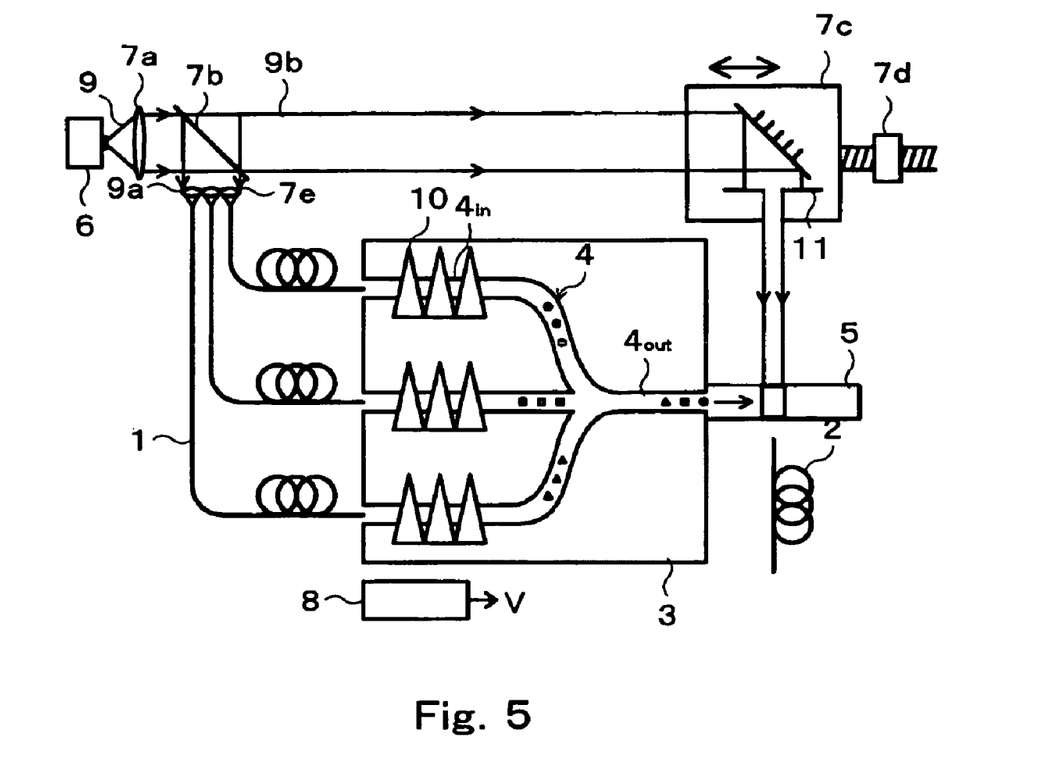
FIG. 5 is a schematic diagram illustrating how components of an optical system can be arranged for preparing a holographic filter for use in an optical cross-connect device according to the present invention.

FIG. 5 is an arrangement plan for an optical system used to fabricate the holographic filter 5 in an optical cross-connect device according to the present invention. The holographic filter 5 is fabricated, here, in order to incorporate a light switching function in the device. To this end, an optical system is provided including a laser unit 6, a lens 7a, a beam splitter 7b, and a reflecting mirror 7c mounted to a mirror drive unit 7d for moving the reflecting mirror 7c bidirectionally parallel to the holographic filter 5 to preform and record holograms in a recording material forming the holographic filter 5. Since this preforming operation is carried out in the system before the optical cross-connect device is allowed to work, the time required to form and record the preformed hologram affects in no way the switching speed in an optical communication to be performed with the optical cross-connect device. For this reason, the laser unit 6 used in this process step need not be high enough in output power and the recording medium forming the holographic filter 5 need not necessarily be highly sensitive. Accordingly, high economical efficiency, coupled with many possible choices of materials for the holographic filters 5, constitutes characteristic features of the present invention.

A form of implementation of the present invention will be described with reference to the arrangement plan of FIG. 5 for the optical system used to fabricate the holographic filter 5 in the optical cross-connect device of the present invention. In the process step of fabricating the holographic filter 5, a hologram is recorded in a recording medium such as of photorefractive crystal, photopolymer or photorefractive polymer to form the holographic filter 5. To this end, a laser beam 9 of a wavelength in an optical communication band transmitted from the laser unit 6 and collimated by a lens 7a to have a fixed uniform diameter is split by a beam splitter 7b into a first and a second collimated beam 9a and 9b with which the recording medium is to be irradiated. Each of such first collimated light beams 9a past a lens array 7e is input directly past an input optical fiber 1 into an inlet passage 4in of the multimode waveguide 4, then eventually reaching the recording medium forming the holographic filter 5. The second collimated light beam 9b is reflected by the reflecting mirror 7c mounted to the mirror drive unit 7d movably parallel to the holographic filter 5, and the drive unit 7d is used to position the reflecting mirror 7c so that the reflected second beam 9b is then incident on a particular area of the recording medium forming holographic filter 5 for irradiation therewith. In this way, the first and second light beams 9a and 9b formed split from the single source and advanced in the two different optical paths intersect at such a particular area in the recording medium and interfere with each other, thereby forming a hologram. Thus, a series of holograms required for the cross-connect device of the present invention can be prerecorded in the holographic filter 5.

Mention is next made in further detail of a technique for recording such holograms in the recording medium forming the holographic filter 5. A basic technique of forming a variety of speckle patterns in a photorefractive material is in terms of a particular shape of an electrode 10 and a particular number of its sub-elements, and a particular voltage V applied to the electrode 10 to determine a particular speckle pattern. Further, a switching condition is set up to form in the photorefractive material a series of such holograms spaced apart from one another by a-preselected distance. Forming the holographic filter 5 in this manner permits output optical paths to be selectively determined. Since the formation of holograms is not carried out in the course of a communication as mentioned above, no temporal limitation is imposed on their forming or elimination.

Once a holographic filter 5 has been fabricated in this manner, the laser unit 6, the lens system 7a, the beam splitters 7b, the reflecting mirror 7c and the mirror drive unit 7d are simply removed from the communication system of the optical cross-connect device while leaving its other parts and components intact. This makes the device a system that is simple, readily serviceable and economical.

Mention is next made of the switching function that constitutes the heart of the optical cross-connect device of the present invention. Its basic principles are based on pattern matching and mismatching between any input speckle pattern and any speckle pattern stored in the holograms. This is given by a cross-correlation function as follows:

$$Ci,j = Pi \times Pj$$

where Pi is an i-th input speckle pattern and Pj is a j-th stored speckle pattern and where i=1, 2, . . . , N and j=1, 2, . . . , N. The correlation Ci, j between Pi and Pj by the theorem becomes 1 (maximum) if Pi=Pj and otherwise 0 (minimum) because of their statistical orthogonality. This means that if Pi=Pj, the i-th input can be selectively cross-connected to the j-th output associated with the j-th speckle pattern Pj with which the input speckle pattern Pi is found to coincide.

Figure 6:
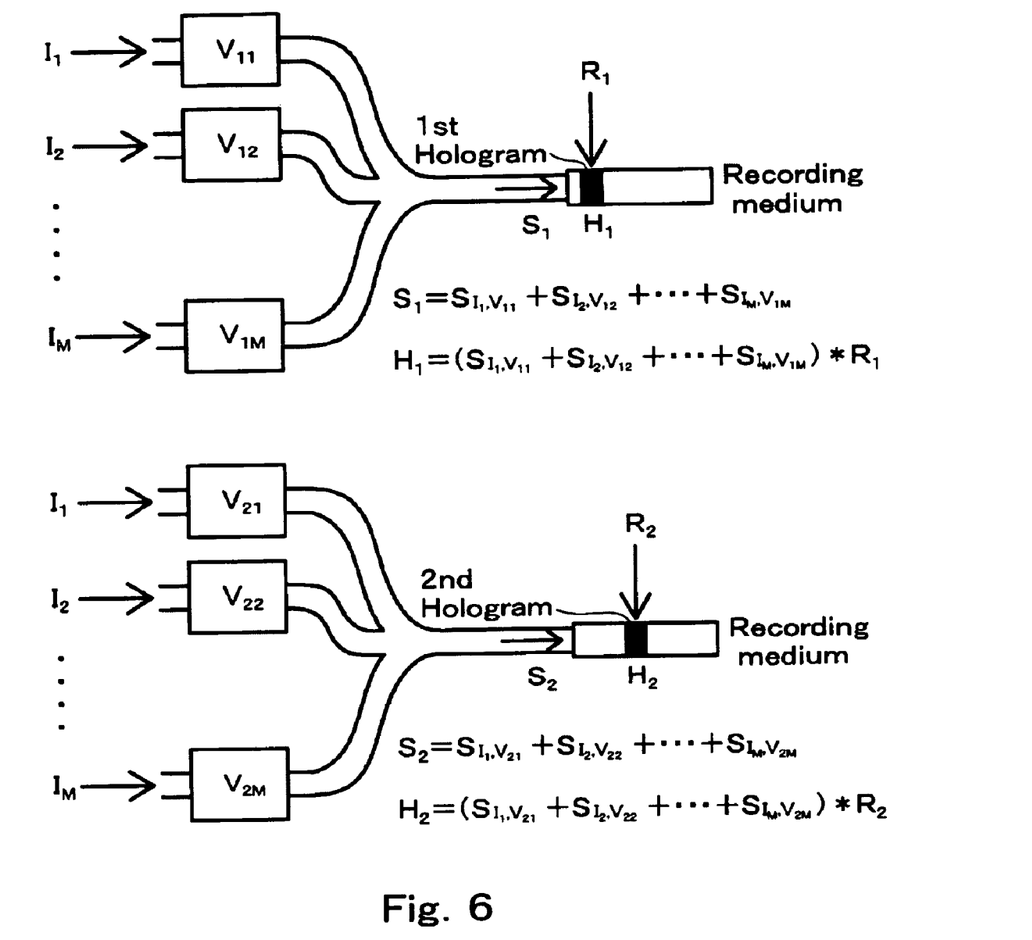
FIG. 6 is a schematic diagram illustrating principles adopted in preparing such a holographic filter.

FIG. 6 schematically illustrates principles of fabricating the holographic filter 5. A first hologram $H_1$ may be recorded on a recording medium becoming the holographic filter 5 as follows: Referring to FIG. 6, assume, for example, that in the multimode optical waveguide 4, a first speckle pattern is formed for an input light signal $I_1$ carried by a laser beam past a first inlet waveguide passage 4in with a voltage $V_{11}$ applied thereto, a second speckle pattern is formed for an input light signal $I_2$ carried by a laser beam past a second inlet waveguide passage 4in with a voltage $V_{12}$ applied thereto and so on, and an M-th speckle pattern is formed for an input light signal $I_{1M}$ carried by a laser beam past an M-th inlet waveguide passage 4in with a voltage $V_{1M}$ applied thereto. With these M speckle patterns expressed by $S_{I1,V11}$, $S_{I2,V12}$, . . . , $S_{IM,V1M}$, respectively, they are coupled together in the single outlet waveguide passage 4out of the multimode waveguide 4 and then enters the recording medium 5, in the form of a multimode speckle pattern: $S_1 = S_{I1,V11} + S_{I2,V12}, \ldots, S_{IM,V1M}$ as shown. Those input light signals $I_1, I_2, \ldots, I_M$ are each a light signal carried by a laser beam 9a from the laser unit 6 split by the beam splitter 7b, and past an inlet waveguide passage 4in of the multimode waveguide 4 where a relevant voltage is applied thereto. Therefore, the multimode light carrying the combined speckle pattern $S_1 = S_{I1,V11} + S_{I2,V12}, \ldots, S_{IM,V1M}$ is intersected by and interferes with a reference light R1 as the other split counterpart from the laser unit 6 in a H1 region of the recording medium 5 where a hologram $H_1$ is formed in the form of $H_1 = (S_{I1,V11} + S_{I2,V12}, \ldots, S_{IM,V1M})^* R_1$. A second hologram $H_2$ is likewise formed at a second hologram region, adjacent to the first, on the recording medium 5. In this case, it is assumed that voltages $V_{21}, V_{22}, \ldots, V_{2M}$ are applied to the inlet passages $4in_1, 4in_2, \ldots, 4in_M$ for a first, a second, . . . , M-th input light signals $I_1, I_2, \ldots, I_M$, respectively. Then, it can be seen that the multimode speckle pattern is obtained in the form of $S_2 = S_{I2,V21} + S_{I2,V22}, \ldots, S_{IM,V2M}$ as shown and the second hologram ensues as $H_2 = (S_{I2,V21} + S_{I2,V22}, \ldots, S_{IM,V2M})^* R_1$. In this manner, a series of holograms which are N in number as desired are formed and recorded in the recording medium to form the holographic filter 5.

Figure 7:
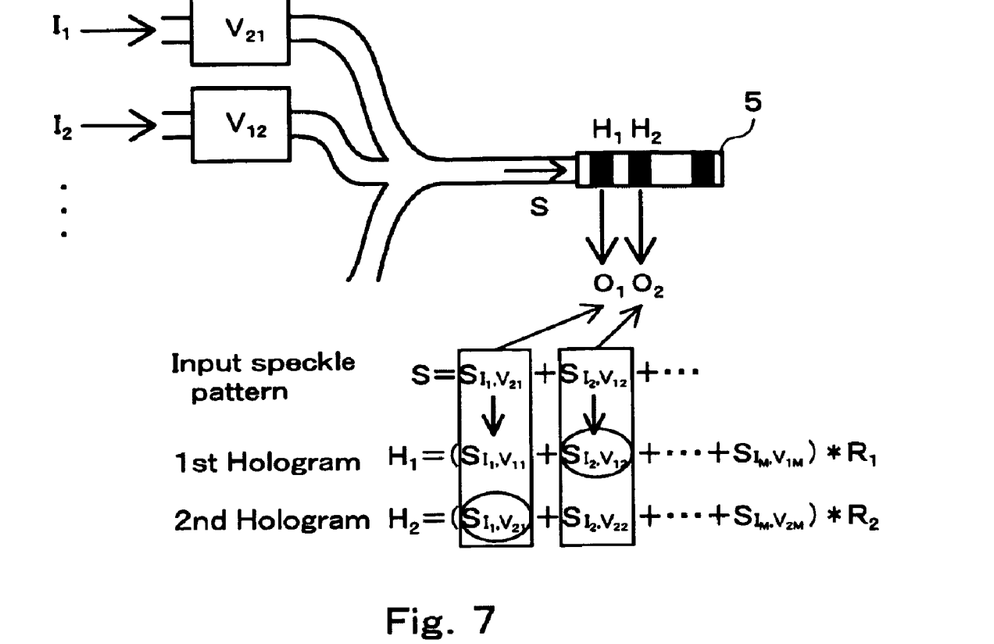
FIG. 7 is a schematic diagram illustrating principles of diffraction by such a holographic filter.

FIG. 7 schematically illustrates principles of diffraction used in the optical switching of input light signals into desired outputs selectively. Let it be assumed that voltages $V_{21}$ and $V_{12}$ are applied to electrodes 10 and 10a at the single mode waveguides 4in and 4out for input light signals $I_1$ and $I_2$, respectively. It can then be seen that the multimode speckle pattern for the multimode light takes the form of $S = S_{I1,V21} + S_{I2,V12} + \ldots$, entering the holographic filter 5 having the first and second holograms: $H_1 = (S_{I1,V11} + S_{I2,V12}, \ldots, S_{IM,V1M})^* R_1$ and $H_2 = (S_{I2,V21} + S_{I2,V22}, \ldots, S_{IM,V2M})^* R_1$ and, as a result, the input signal components $I_1$ and $I_2$ of the multimode light are filtered though the second and first holograms $H_2$ and $H_1$ in the holographic filter 5 and thereby switched into output optical wave guides $O_2$ and $O_1$ associated with the second and first holograms $H_2$ and $H_1$, respectively. To wit, the multimode light passing through the holographic filter 5 with the recorded holograms is diffracted at regions thereof where the aforementioned cross correlation applies, thereby permitting its diffracting signal components to selectively pass into output waveguides associated with these regions, respectively. Thus, controlling the voltages on the electrodes (10, 10a) associated with the inlet passages 4in of the multimode mode optical waveguide 4 for input light signals allows these light signals to issue selectively from output waveguides associated with the holograms recorded upon forming speckle patterns with those voltages controlled. In this case, each voltage may be applied in a binary form, i.e., as either ON (1) and OFF (0), or in an analog form, or in a combined binary and analog form.

Referring back to FIG. 1, a light address detector 14 is thus provided which are responsive to input light beams, M in number, reflected by the dichromatic mirror 13 for detecting the respective addresses of light signals carried by these input light beams, respectively. The light address detector 14 is connected to the power supply 8 to cause voltages corresponding to these signal addresses to be applied from the power supply 8 to the light beams passing through the inlet passages 4in M in number, of the multimode optical waveguide 4, respectively. Each of these respective addresses or destinations of the light signals is, here represented by a particular speckle pattern, and hence a particular voltage that is required to produce such a speckle pattern, to coincide with a particular speckle pattern stored in a particular hologram in the holographic filter 5, namely the signal destination or outlet.

An optic device for cross-connecting a plurality of input light signals incoming from a plurality of inlet optical waveguides to a plurality of outlet optical waveguides is thus provided, which comprises an optic switch. The optic switch includes a multimode optical waveguide 4 having a plurality of inlet passages 4in of and a single outlet passage 4out into which the inlet passages $4_{in}$ converge, the inlet passages $4_{in}$ receiving the input light signals, each carried by a laser beam (9a), from the inlet optical waveguides, respectively. A plurality of electrode means (10 and 10a) are provided each of which is associated with each of the inlet passages 4in of the multimode optical waveguide 4, respectively. A power supply means 8 is included for applying different control voltages ($V_1, V_2, V_3, \ldots$) across the electrode means (10 and 10a), respectively, such that different speckles patterns are formed associated with those laser beams past the inlet passages 4in of the multimode optical waveguides 4, respectively. The laser beams (9a) are converted into a multimode laser beam in the single outlet passage 4out of the multimode optical waveguide 4in which the different speckle patterns are linearly joined together into a multimode speckle pattern. Further, a holographic filter 5 is included for receiving this multimode speckle pattern containing those different speckle patterns and filtering the multimode laser beam containing the input light signals from the multimode optical waveguide 4, the holographic filter 5 having a plurality of preformed different multimode speckle patterns, and each in the form of a hologram $H_1$, $H_2$, ..., $H_N$ thereof, in a plurality of successive regions of the filter which have the outlet optical waveguides associated therewith, whereby the holographic filter 5 selectively switches, addresses and cross-connects a said input light signal to a said outlet optical waveguide through a said region of the holographic filter 5 where a said received speckle pattern that is associated with the input light signal coincides with a said preformed speckle pattern.

Preferably, the optic switch includes a set of waveguide supporting substrates 3 mounted one on top of another, corresponding in number to different wavelengths ($\lambda_1$, $\lambda_2$, ..., $\lambda_L$) carrying input light signals, in each of which waveguide supporting substrates 3 there is formed a multimode optical waveguide 4 comprising an outlet passage 4out and a plurality of inlet passages 4in that converge into the single outlet passage 4out, and a set of holographic filter plates mounted one on top of another, corresponding in number to the waveguide supporting substrates 3. Each of the holographic filter plates is formed therein with the holographic filter 5 and attached to each of the waveguide supporting substrates 3, respectively, so that the holographic filter 5 and the multimode optical waveguide 4' in a said waveguide supporting substrate 3 and a said holographic filter plate attached together communicate with each other.

Figure 8:
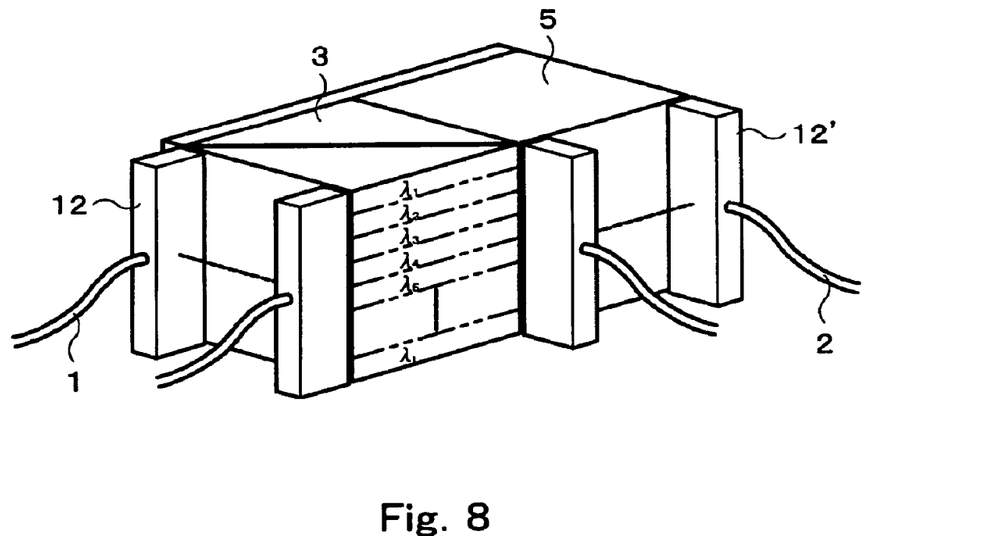
FIG. 8 is a perspective view schematically illustrating an optical switching module of the present invention.

The optic switch mentioned above may, as shown in FIGS. 1 and 8, be connected between a first and a second set of AWG (Arrayed Waveguide Grating) type coupler/dividers (converters) 12, 12' having a first and a second set of optical fiber cables connected thereto, respectively. These sets of AWG converters may be formed in respective sets of AWG plates, and the AWG plates of each set are mounted side by side in a direction transverse to a direction in which the waveguide supporting substrates 3/holographic filter plates are mounted one on top of another. Then, the AWG type converters of the first set 12 in receipt of a plurality of sets of incoming optical communication signals mixed in wavelength, i.e., of different wavelength, i.e., of different wavelengths ($\lambda_1$, $\lambda_2$, ..., $\lambda_L$) from the optical fiber cables of the first set, respectively, may be adapted to convert them into a plurality of sets of light signals, respectively, with each set of such light signals being of an identical wavelength ($\lambda_1$, $\lambda_2$, ..., $\lambda_L$) for entry into the inlet passages 4in of the multimode optical waveguide 4 in each of the waveguide supporting substrates 3, respectively, and the AWG converters of the second set 12' in re- 3, respectively, and the AWG converters of the second set 12' in receipt of a plurality of sets of output light signals with each set of such output light signals of an identical wavelength ($\lambda_1$, $\lambda_2$, ..., $\lambda_L$) from the holographic filter 5 in each of the holographic filter plates, respectively, may be adapted to convert them into a plurality of sets of optical communication signals mixed in wavelength, i.e., of different wavelengths ($\lambda_1$, $\lambda_2$, ..., $\lambda_L$) which are outgoing through the optical fiber cables of the second set, respectively.

Thence, between the first and second sets of AWG (Arrayed Waveguide Grating) type coupler/dividers (converters) 12, 12' there may advantageously be formed, as shown in FIG. 1, another or a second optic switch that includes a second set of waveguide supporting substrates 3 mounted one on top of another, corresponding in number to different wavelengths ($\lambda_1$, $\lambda_2$, ..., $\lambda_L$) carrying input light signals. The waveguide supporting substrates 3 of the second set as are those of the first set are each formed therein with a multimode optical waveguide 4 comprising a set of inlet passages 4in that converge into a single outlet passage 4out. Also included is a second set of holographic filter plates mounted one on top of another, corresponding in number to the waveguide supporting substrates 3 of the second set, and these holographic filter plates as are those of the first set are each formed therein with a holographic filter 5 and attached to each of these waveguide supporting substrates 3, respectively, so that the holographic filter 5 and the multimode optical waveguide 4 in a said waveguide supporting substrate of the second set and a said holographic filter plate of the second set attached together communicate with each other. Then, the AWG type converter of the second set 12' in receipt of a plurality of sets of incoming optical communication signals mixed in wavelength, i.e., of different wavelengths ($\lambda_1$, $\lambda_2$, ..., $\lambda_L$) from the optical fiber cables of the second set, respectively, may be adapted to convert them into a plurality of sets of light signals, respectively, with each set of such light signals being of an identical wavelength ($\lambda_1$, $\lambda_2$, ..., $\lambda_L$) for entry into the inlet passages 4in of the multimode optical waveguide 4 in a said waveguide supporting substrate 3 of the second set, respectively, and the AWG plates of the first set 12 in receipt of a plurality of sets of output light signals with each set of such output light signals of an identical wavelength ($\lambda_1$, $\lambda_2$, ..., $\lambda_L$) from the holographic filter 5 in a said holographic plates of the of the second set, respectively, may be adapted to convert them into a plurality of sets of optical communication signals mixed in wavelength, i.e., of different wavelengths ($\lambda_1$, $\lambda_2$, ..., $\lambda_L$) which are outgoing through the optical fiber cables of the first set, respectively. So constructed as mentioned above, the device is made operative bidirectionally.

As set forth in the foregoing description, there is provided a highly compact, high switching speed and low cost optic switch in accordance with the present invention. The optic switch is capable of cross-connecting input fibers to output optical fibers, and cross-connecting light signals which are M×N×L in number (where M and N are the numbers of input and output optical fibers, respectively, and L is the number of wavelengths) between the input and output fiber cables at an extremely high switching speed that is achieved by forming and changing speckle patterns as desired with the use of an electrooptical effect and by simply passing the input light signals through the optic switch having preformed holographic filters. The preformed holographic filters had in the optic switch is highly advantageous in that its performing process or the process of pre-recording holograms in a recording medium affects in no way the switching operation of the optic switch when it is working. A large number of holographic filters having various sets of holograms corresponding to a desired number of sets of speckle patterns can be prepared and stored. Thus, the optic switch is allowed to carry several hundreds to thousands of channels sufficient to meet with the requirements of an ultra-large scale WDM transmission system. The optic switch is so compact that it can be built up into a total size of, e.g., 6.5 cm×6.5 cm×2.5 cm. The switching speed of the optic switch is as high as only requiring a time period for switching as short as 1 to 2 ms so that it rapidly drives it forward to build up a next generation photonic network.

Although the present invention has hereinbefore been set forth with respect to certain illustrative embodiments thereof, it will readily be appreciated to be obvious to those skilled in the art that many alterations thereof, omissions therefrom and additions thereto can be made without departing from the essences of scope of the present invention. Accordingly, it should be understood that the invention is not intended to be limited to the specific embodiments thereof set forth above, but to include all possible embodiments that can be made within the scope with respect to the features specifically set forth in the appended claims and to encompass all tures specifically set forth in the appended claims and to encompass all the equivalents thereof.

What is claimed is:

1. A method of cross-connecting a plurality of input light signals incoming from a plurality of inlet optical waveguides to a plurality of outlet optical waveguides, the method comprising the steps of:
   a) preparing a holographic filter having a series of preformed different speckle patterns in a series of regions thereof having said plurality of outlet optical waveguides associated therewith, respectively;
   b) passing the input light signals, each carried by a laser beam, through a plurality of inlet passages of a multimode optical waveguide, respectively, with different control voltages applied across them, respectively, to form different speckle patterns associated with those laser beams, respectively, and
   c) introducing the laser beams past the respective inlet passages, and then past a single outlet passage, of said multimode optical waveguide, into said holographic filter wherein coincidence of a said formed speckle pattern with a said preformed speckle pattern in a said region of the holographic filter allows a said input light signal associated with the said formed coincident speckle pattern to be selectively switched, addressed and cross-connected to a said output optical waveguide that is associated with the said coincident region of the holographic filter.

2. A method as set forth in claim 1 wherein said preformed different speckle patterns are prerecorded in the form of a hologram thereof in a recording medium becoming the holographic filter by:
   $a_1$) splitting a laser beam of a uniform mode into a first and a second laser beam, passing such first laser beams through the inlet passages of said multimode optical waveguide with a set of different control voltages applied across them, respectively, to form speckle patterns each as a function of a said applied voltage, joining the first laser beams together past said multimode optical waveguide into a single multimode laser beam having said different speckle patterns associated therewith and causing the multimode laser beam to intersect with the second laser beam at one of said regions of the recording medium to cause them to interfere with each other thereat, thereby recording said different speckle patterns as a set in the form of a hologram thereof at said one region, and
   $a_2$) repeating the step $a_1$) successively while applying different sets of different control voltages across the inlet passages of said multimode optical waveguide and recording resultant successive sets of speckle patterns in the form of holograms thereof successively at following successive regions in said recording medium, thereby forming said holographic filter.

3. A method as set forth in claim 1 or claim 2 wherein said recording medium forming said holographic filter is made of a material selected from the group that consists of photorefractive crystal, photopolymer and photorefractive polymer.

4. A method as set forth in claim 1 or claim 2 wherein said different speckle patterns individually formed past the respective inlet passages of said multimode optical waveguide are linearly added together in the single outlet passage of said multimode optical waveguide prior to entering said holographic filter.

5. A method as set forth in claim 1 or claim 2 wherein said voltages are binary voltages.

6. A method as set forth in claim 1 or claim 2 wherein said voltages are analog voltages.

7. A method as set forth in claim 1 or claim 2 wherein said voltages are a combination of binary and analog voltages.

8. A method of cross-connecting a plurality of input light signals incoming from a plurality of inlet optical waveguides to a plurality of outlet optical waveguides, the method comprising the steps of:
   a) preparing a holographic filter having a series of holograms, each containing preformed different speckle patterns, in a series of regions thereof having said plurality of outlet optical waveguides associated therewith, respectively;
   b) detecting respective addresses of the input light signals carried by laser beams;
   c) guiding the laser beams through a multimode waveguide having a plurality of inlet passages and a single outlet passage by passing the laser beams through said inlet passages provided with a plurality of electrode means, respectively, while applying preselected control voltages across said electrode means, respectively, to produce, associated with the laser beams guided through the inlet passages of said multimode optical waveguides particular speckle patterns preselected corresponding to the detected addresses of said light signals, respectively,
   d) introducing the laser beams containing said particular speckle patterns past the respective inlet passages and then past the single outlet passage of said multimode optical waveguide into said holographic filter, wherein said particular speckle patterns cross-correlate with said preformed speckle patterns of each hologram in said holographic filter.

* * * * *